(12) United States Patent
Kang et al.

(10) Patent No.: US 9,029,857 B2
(45) Date of Patent: May 12, 2015

(54) ORGANIC LIGHT EMITTING DISPLAY DEVICE AND MANUFACTURING METHOD THEREOF

(75) Inventors: Jin-Goo Kang, Yongin (KR); Young-In Hwang, Yongin (KR); Ji-Young Kim, Yongin (KR); Hyo-Seok Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 309 days.

(21) Appl. No.: 13/096,330

(22) Filed: Apr. 28, 2011

(65) Prior Publication Data

US 2012/0097951 A1  Apr. 26, 2012

(30) Foreign Application Priority Data

Oct. 26, 2010 (KR) .................. 10-2010-0104740
Apr. 27, 2011 (KR) .................. 10-2011-0039729

(51) Int. Cl.
*H01L 27/32* (2006.01)

(52) U.S. Cl.
CPC .................................. *H01L 27/3223* (2013.01)

(58) Field of Classification Search
None
See application file for complete search history.

(56) References Cited

U.S. PATENT DOCUMENTS

| | | | |
|---|---|---|---|
| 6,476,988 B1 | 11/2002 | Yudasaka | |
| 7,205,715 B2 | 4/2007 | Park | |
| 7,273,801 B2 | 9/2007 | Seki et al. | |
| 7,354,520 B2 | 4/2008 | Okada et al. | |
| 7,795,809 B2 | 9/2010 | Ito et al. | |
| 2001/0013607 A1* | 8/2001 | Miyasaka | 257/66 |
| 2002/0155319 A1* | 10/2002 | Kawamura et al. | 428/690 |
| 2003/0038913 A1 | 2/2003 | Choo | |
| 2003/0117794 A1* | 6/2003 | Lu et al. | 362/84 |
| 2003/0178937 A1* | 9/2003 | Mishima | 313/511 |
| 2005/0116631 A1* | 6/2005 | Kim et al. | 313/506 |

(Continued)

FOREIGN PATENT DOCUMENTS

| | | |
|---|---|---|
| KR | 1020060001717 | 1/2006 |
| KR | 1020060094708 A | 8/2006 |

(Continued)

OTHER PUBLICATIONS

The Summons to oral proceedings issued on Aug. 29, 2014 by EPO in connection with corresponding European Patent Application No. 11171762.5.

(Continued)

*Primary Examiner* — Fei Fei Yeung Lopez
(74) *Attorney, Agent, or Firm* — Robert E. Bushnell, Esq.

(57) ABSTRACT

An organic light-emitting display device includes a substrate including a rectangular light-emitting area and a circuit area, the circuit area including a thin film transistor, the light-emitting area including an electroluminescent layer produced by a solution deposition process, the light-emitting area being bounded by a first major side, a second major side, a first minor side and a second minor side, the first major side being opposite from and parallel to a second major side, each of these sides having wiring or dummies arranged thereat, and a pixel defining layer arranged on the wirings and on the dummies. In order to produce a uniform thickness electroluminescent layer via a solution deposition process, top surfaces of the pixel defining layer on each of the wirings and dummies that border the light emitting area are arranged in a same plane that is parallel to the substrate.

32 Claims, 7 Drawing Sheets

(56) References Cited

U.S. PATENT DOCUMENTS

| | | |
|---|---|---|
| 2005/0121672 A1* | 6/2005 | Yamazaki et al. ............... 257/59 |
| 2005/0140274 A1 | 6/2005 | Lee et al. |
| 2005/0140306 A1* | 6/2005 | Park .......................... 315/169.3 |
| 2006/0001363 A1 | 1/2006 | Park et al. |
| 2006/0125381 A1* | 6/2006 | Oh ................................ 313/504 |
| 2006/0186822 A1* | 8/2006 | Park .......................... 315/169.3 |
| 2007/0001591 A1* | 1/2007 | Tanaka .......................... 313/504 |
| 2007/0052119 A1 | 3/2007 | Sakai et al. |
| 2007/0194318 A1 | 8/2007 | Jung et al. |
| 2008/0157099 A1* | 7/2008 | Yang et al. ..................... 257/83 |
| 2008/0309221 A1 | 12/2008 | Lang et al. |
| 2009/0085909 A1* | 4/2009 | Chen et al. ................... 345/214 |
| 2009/0135104 A1* | 5/2009 | Jeong ............................. 345/76 |
| 2009/0160741 A1* | 6/2009 | Inoue et al. ..................... 345/76 |
| 2009/0284135 A1* | 11/2009 | Yoshida et al. ............... 313/504 |
| 2009/0284449 A1 | 11/2009 | Lee et al. |
| 2010/0244725 A1* | 9/2010 | Adamovich et al. .......... 315/291 |

FOREIGN PATENT DOCUMENTS

| | | |
|---|---|---|
| KR | 1020070083003 A | 8/2007 |
| KR | 1020090120093 | 11/2009 |
| KR | 1020090131903 A | 12/2009 |
| KR | 1020100021311 A | 2/2010 |

OTHER PUBLICATIONS

European Patent Office Action issued by EPO on Nov. 27, 2014 in connection with European Patent application No. 11 171 762.5.

* cited by examiner

ORGANIC LIGHT EMITTING DISPLAY DEVICE AND MANUFACTURING METHOD THEREOF

CLAIM OF PRIORITY

This application makes reference to, incorporates the same herein, and claims all benefits accruing under 35 U.S.C. §119 from applications for ORGANIC LIGHT-EMITTING DISPLAY DEVICE AND MANUFACTURING METHOD THEREOF earlier filed in the Korean Intellectual Priority Office on 26 Oct. 2010 and there duly assigned Serial No. 10-2010-0104740 and filed in the Korean Intellectual Priority Office on 27 Apr. 2011 and there duly assigned Serial No. 10-2011-0039729.

BACKGROUND OF THE INVENTION

1. Field of the Invention

The present invention relates to an organic light-emitting display device in which an electroluminescent (EL) layer is formed by a printing method, and a manufacturing method thereof.

2. Description of the Related Art

Organic light-emitting display devices exhibiting superior characteristics in viewing angle, contrast, response speed, and consumption power have extended their application range from personal portable devices, such as MP3 players or mobile phones, to televisions.

When the EL layer included in an organic light-emitting display device is formed by a printing method, uniformity in the thickness of an EL layer is determined at an edge of a light-emitting area according to the step of a structure around the light-emitting area including the EL layer. In a conventional organic light-emitting display device, the step of a structure around a light-emitting area is not constant. Thus, since the uniformity in the thickness of an EL layer is not maintained constant, the quality of an organic light-emitting display device may deteriorate.

SUMMARY OF THE INVENTION

To solve the above and/or other problems, the present invention provides an organic light-emitting display device in which the step of a structure around a light-emitting area is made constant so that an electroluminescent (EL) layer may be formed with a uniform thickness by a printing method, and a manufacturing method thereof. According to an aspect of the present invention, there is provided an organic light-emitting display device that includes a substrate including a light-emitting area and a circuit area, the circuit area including a thin film transistor, the light-emitting area including an electroluminescent layer, the light-emitting area being bounded by a first side, a second side, a third side and a fourth side, the first side being opposite from a second side, the third side being adjacent to the first side and opposite from a fourth side, a first wiring arranged adjacent and parallel (or corresponding) to the first side of the light-emitting area, a second wiring arranged adjacent and parallel (or corresponding) to the second side of the light-emitting area, a first dummy arranged adjacent and parallel (or corresponding) to the third side of the light-emitting area, a second dummy arranged adjacent and parallel (or corresponding) to the fourth side of the light-emitting area and a pixel defining layer arranged on the first wiring, the second wiring, the first dummy and the second dummy, wherein at least one of the first wiring, the second wiring, the first dummy and the second dummy are electrically connected to the circuit area, wherein a top surface of the pixel defining layer that corresponds to each of the first wiring, the second wiring, the first dummy and the second dummy are all arranged on a same plane that is parallel to the substrate.

The light-emitting area may be rectangular or oblong. The first dummy or the second dummy may be electrically coupled to the first wiring or the second wiring. The first dummy and the second dummy may not be electrically coupled to the first wiring and the second wiring. Heights of the first wiring, the second wiring, the first dummy, and the second dummy may all be identical. Widths of the first wiring, the second wiring, the first dummy, and the second dummy may all be identical. The circuit area may be arranged at a location where a first area and a second area overlap, the first area being arranged on an opposite side of an extension line of the third side of the light-emitting area than the light-emitting area and the second area being arranged on an opposite side of an extension line of the second side of the light-emitting area than the light emitting area.

The thin film transistor may include an active layer arranged on the substrate, a gate insulation layer covering the active layer, a gate electrode arranged on the gate insulation layer and corresponding to the active layer, an interlayer insulation layer covering the gate electrode and a source electrode and a drain electrode arranged on the interlayer insulation layer, the source electrode and the drain electrode being insulated from the gate electrode and being electrically connected to the active layer. The organic light-emitting display device may also include a passivation layer covering the source electrode and the drain electrode; and a pixel electrode arranged on the passivation layer, wherein the pixel electrode is connected to one of the source electrode and the drain electrode through a via hole arranged in the passivation layer and within the circuit area. The first wiring, the second wiring, the first dummy, and the second dummy may be arranged on a same layer that the source electrode and the drain electrode of the thin film transistor are arranged.

The organic light-emitting display device may also include a gate insulation layer arranged on the substrate and an interlayer insulation layer covering the gate insulation layer, wherein the first wiring and the second wiring are parallel to each other, arranged on the interlayer insulation layer, and spaced-apart from each other by the light-emitting area, wherein a passivation layer is further arranged between the first wiring, the second wiring and the pixel defining layer. The display may also include a pixel electrode arranged on the passivation layer between the first wiring and the second wiring, the electroluminescent layer being arranged on the pixel electrode, the electroluminescent layer having a uniform thickness, being produced by solution deposition process and including an organic light-emitting layer and an opposite electrode arranged on the electroluminescent layer, wherein the light-emitting area is defined by the first wiring and the second wiring.

The display may also include an interlayer insulation layer covering the gate insulation layer, the first dummy and the second dummy being arranged on the interlayer insulation layer and being arranged separately from and parallel to each other with respect to the light-emitting area, wherein a passivation layer is further arranged between the first dummy, the second dummy and the pixel defining layer. The display may also include a pixel electrode arranged on the passivation layer between the first dummy and the second dummy, the electroluminescent layer being arranged on the pixel electrode, the electroluminescent layer having a uniform thickness, being produced by solution deposition process and including an organic light emitting layer and an opposite electrode arranged on the electroluminescent layer, wherein the light-emitting area is defined by the first dummy and the second dummy. The pixel electrode may be arranged on the passivation layer also covers an upper portion of the first dummy and surround the upper portion of the first dummy as well as part of a side surface of the first dummy. The first dummy and the second dummy may include a same material as that of one of first wiring and the second wiring.

According to another aspect of the present invention, there is provided a method of manufacturing an organic light-emitting display device, including defining a light-emitting area of a substrate, the light-emitting area being bounded by a first side, a second side, a third side and a fourth side, the first side being opposite from the second side, the third side being adjacent to the first side and opposite from the fourth side, forming a thin film transistor within a circuit area of the substrate, forming a first wiring adjacent and parallel (or that correspond) to the first side of the light-emitting area, forming a second wiring adjacent and parallel (or that correspond) to the second side of the light-emitting area, forming a first dummy adjacent and parallel (or that correspond) to the third side of the light-emitting area, forming a second dummy adjacent and parallel (or that correspond) to the fourth side of the light-emitting area, wherein at least one of the first wiring, the second wiring, the first dummy and the second dummy are electrically connected to the circuit area; and forming an pixel defining layer on the first wiring, the second wiring, the first dummy, and the second dummy, wherein a top surface of the pixel defining layer that corresponds to each of the first wiring, the second wiring, the first dummy and the second dummy are all arranged on a same plane that is parallel to the substrate.

The light-emitting area may be rectangular or oblong. The first dummy or the second dummy may be electrically coupled to the first wiring or the second wiring. The first dummy and the second dummy may not electrically coupled to the first wiring and the second wiring. Heights of the first wiring, the second wiring, the first dummy, and the second dummy may all identical. Widths of the first wiring, the second wiring, the first dummy, and the second dummy may all identical. The circuit area may be arranged at a location where a first area and a second area overlap, the first area being arranged on an opposite side of an extension line of the third side of the light-emitting area than the light-emitting area and the second area being arranged on an opposite side of an extension line of the second side of the light-emitting area than the light emitting area.

The thin film transistor may be produced by a process including forming an active layer on the substrate, forming a gate insulation layer covering the active layer, forming a gate electrode on the gate insulation layer corresponding to the active layer, forming an interlayer insulation layer covering the gate electrode and forming a source electrode and a drain electrode on the interlayer insulation layer, the source electrode and the drain electrode being insulated from the gate electrode and electrically connected to the active layer. The method may also include forming a passivation layer covering the source electrode and the drain electrode and forming a pixel electrode on the passivation layer, wherein the pixel electrode is connected to one of the source electrode and the drain electrode through a via hole arranged in the passivation layer within the circuit area. The first wiring, the second wiring, the first dummy, and the second dummy may all be arranged on a same layer that the source electrode and the drain electrode of the thin film transistor are arranged.

The method may also include forming a gate insulation layer on the substrate, forming an interlayer insulation layer covering the gate insulation layer, wherein the first wiring and the second wiring are arranged on the interlayer insulation layer, arranged parallel to each other and spaced-apart from each other by the light-emitting area and forming a passivation layer between the first wiring, the second wiring and the pixel defining layer. The method may also include forming a pixel electrode on the passivation layer between the first wiring and the second wiring, the electroluminescent layer being arranged on the pixel electrode, the electroluminescent layer having a uniform thickness, is produced by solution deposition process and includes an organic light emitting layer and forming an opposite electrode on the electroluminescent layer, wherein the light-emitting area is defined by the first wiring and the second wiring.

The method may also include forming a gate insulation layer on the substrate, forming an interlayer insulation layer covering the gate insulation layer and forming a passivation layer between the first dummy, the second dummy and the pixel defining layer, wherein the first dummy and the second dummy are arranged on the interlayer insulation layer and are arranged separately from and parallel to each other with respect to the light-emitting area. The method may also include forming a pixel electrode on the passivation layer between the first dummy and the second dummy, the electroluminescent layer being arranged on the pixel electrode, the electroluminescent layer having a uniform thickness, is produced by solution deposition process and includes an organic light emitting layer and forming an opposite electrode on the electroluminescent layer, wherein the light-emitting area is defined by the first dummy and the second dummy. The pixel electrode may be arranged on the passivation layer also covers an upper portion of the first dummy while surrounding an upper portion of the first dummy and part of a side surface of the first dummy. The first dummy and the second dummy may include a same material as that of one of first wiring and the second wiring.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
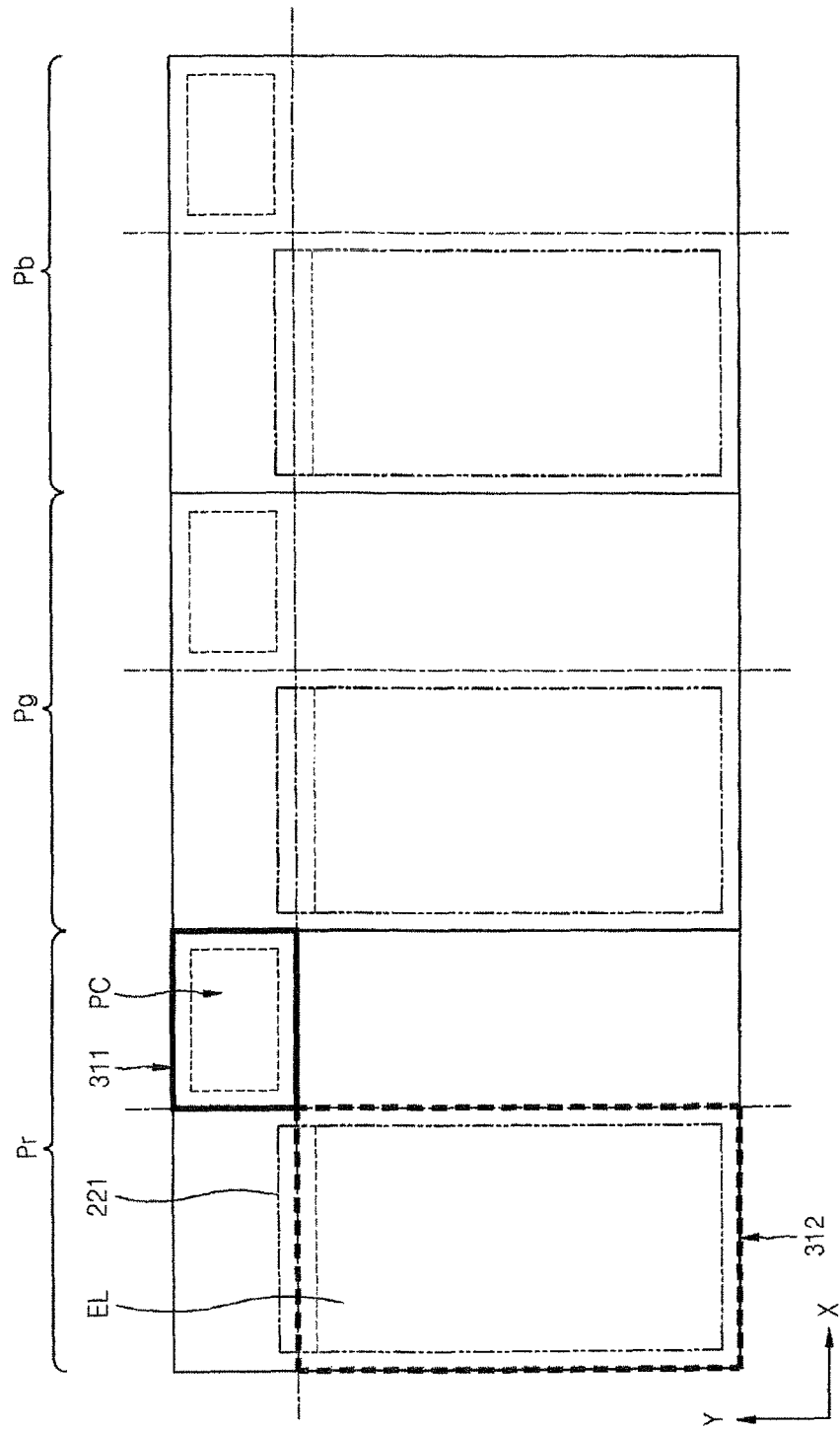
FIG. 1 is a plan view illustrating a red pixel Pr, a green pixel Pg, and a blue pixel Pb, which are adjacent to one another, in an organic light-emitting display device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

In the present specification, the terms such as "first" and "second" are used herein merely to describe a variety of constituent elements, but the constituent elements are not limited by the terms. The terms are used only for the purpose of distinguishing one constituent element from another constituent element.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

One or more embodiments of the present invention will be described in detail with reference to the accompanying drawings.

Figure 2:
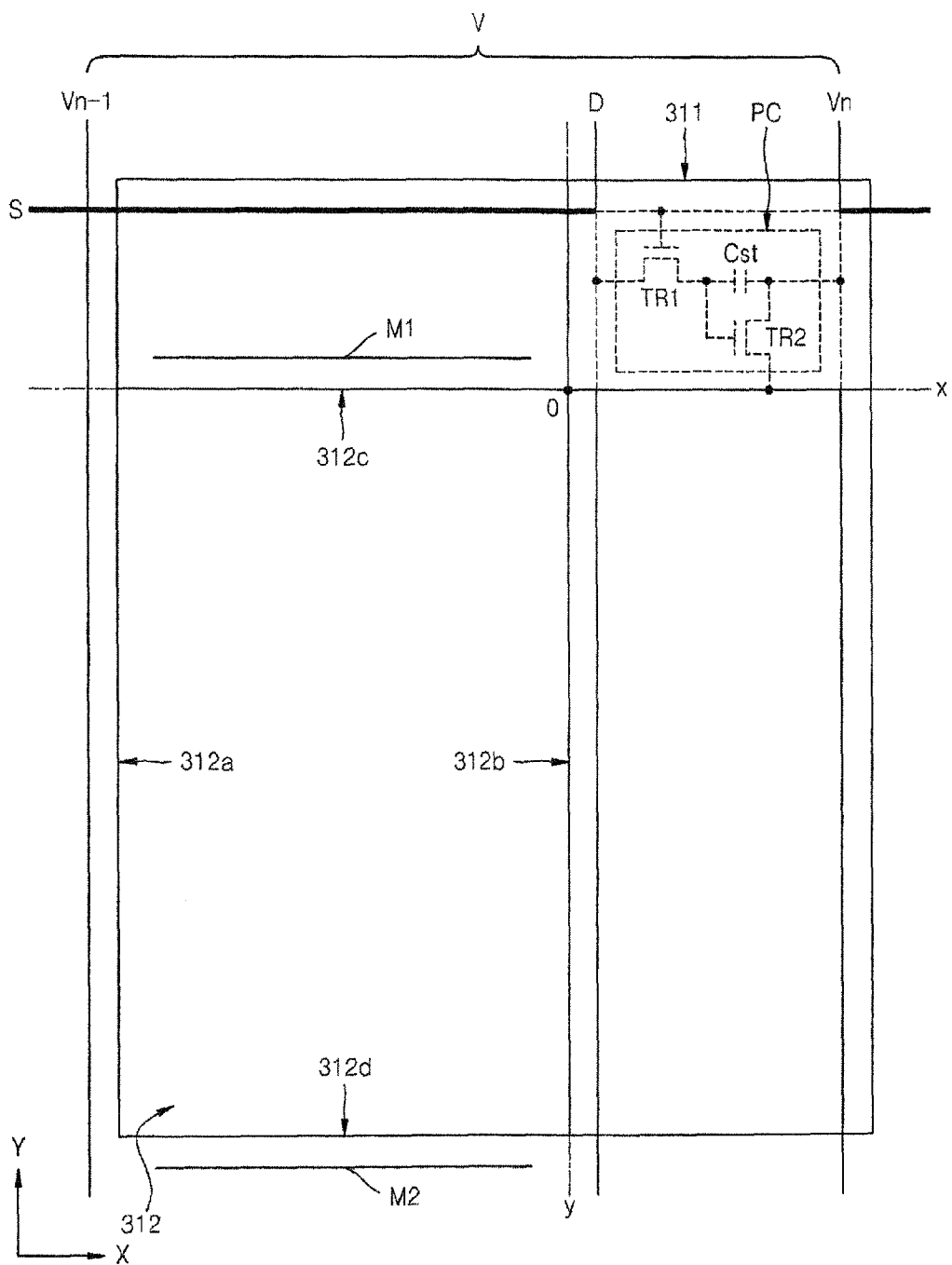
FIG. 2 illustrates a circuit unit of a circuit area included in one of the subpixels of FIG. 1.

Turning now to FIGS. 1 and 2, FIG. 1 is a plan view illustrating a red pixel Pr, a green pixel Pg, and a blue pixel Pb, which are adjacent to one another, in an organic light-emitting display device according to an embodiment of the present invention and FIG. 2 illustrates a circuit unit PC of a circuit area 311 included in one of the subpixels of FIG. 1. As necessary, one of the red pixel Pr, the green pixel Pg, and the blue pixel Pb may be referred to a subpixel.

Referring to FIG. 1, each of the red pixel Pr, the green pixel Pg, and the blue pixel Pb includes the circuit area 311 and a light-emitting area 312. The circuit area 311 includes the circuit unit PC and a via hole (not shown). The circuit unit PC includes at least one thin film transistor (TFT) and at least one capacitor.

As illustrated in FIG. 2, the circuit unit PC is included in the circuit area 311. A plurality of conductive lines such as a scan wiring S, a data wiring D, and a power wiring V are electrically connected to the circuit unit PC. Although it is not shown in FIG. 2, in addition to the scan wiring S, the data wiring D, and the power wiring V, a variety of conductive lines may be provided according to a structure of the circuit unit PC.

Referring to FIG. 2, the circuit unit PC includes a first TFT TR1 connected to the scan wiring S and the data wiring D, a second TFT TR2 connected to the first TFT TR1 and the power wiring V, and a capacitor Cst connected to the first TFT TR1 and the second TFT TR2. The first TFT TR1 functions as a switching transistor, whereas the second TFT TR2 functions as a driving transistor. The second TFT TR2 is electrically connected to a pixel electrode 221 through a via hole (not shown). In FIG. 2, although the first and second TFTs TR1 and TR2 are shown as a P type, the present invention is not limited thereto and at least one thereof may be N type. The number of TFTs and capacitors are not limited to the above description and two or more TFTs and one or more capacitor may be combined according to the circuit unit PC According to the present embodiment, the data wiring D and the power wiring V surround the light-emitting area 312. Also, a first dummy wiring M1 and a second dummy wiring M2 surround the light-emitting area 312. Thus, wirings are symmetrically arranged along the up, down, left, and right sides of the light-emitting area 312.

The light-emitting area 312 is an area defined by the data wiring D, the power wiring V, the first dummy wiring M1, and the second dummy wiring M2. The light-emitting area 312 includes an electroluminescent (EL) layer EL and the pixel electrode 221. The pixel electrode 221 is formed under an EL layer EL, covers the whole area of the light-emitting area 312, and is connected to the circuit area 311 through the via hole. An opposite electrode 222 covers the whole area of the circuit area 311 and the light-emitting area 312.

Referring now to FIG. 2, the light-emitting area 312 may have a rectangular or oblong shape. The light-emitting area 312 includes a first major side 312a corresponding to a long side of a rectangle or oblong shape and a second major side 312b parallel to and separated from the first major side 312a. The light-emitting area 312 also includes a first minor side 312c corresponding to a short side of the rectangle or oblong shape and a second minor side 312d parallel to and separated from the first minor side 312c. The first and second minor sides 312c and 312d are arranged perpendicular to the first and second major sides 312a and 312b. Although the light-emitting area 312 is illustrated as having an oblong or a rectangular shape in FIG. 3, the present invention is in no way so limited as the light-emitting area 312 may instead have an oval shape surrounded by the first major side 312a, the second major side 312b, the first minor side 312c, and the second minor side 312d, which are imaginary. The circuit area 311 is separated diagonally from the light-emitting area 312. The circuit area 311 and the light-emitting area 312 are symmetrical about a point where extension lines of the second major side 312b and the first minor side 312c cross. For example, the circuit area 311 is formed at a location where an outside area where the light-emitting area 312 is not present with respect to the extension line of the second major side 312b of the light-emitting area 312, and an outside area where the light-emitting area 312 is not present with respect to the extension line of the first minor side 312c of the light-emitting area 312, overlap each other. In other words, assuming that the extension line of the second major side 312b is a y-axis, the extension line of the first minor side 312c is an x-axis, and a point where the x-axis and the y-axis meet is the origin, the circuit area 311 is arranged at a location corresponding to the first quadrant and the light emitting area is arranged at a location that corresponds to the third quadrant.

However, the present embodiment is not limited thereto as the circuit area 311 may instead be arranged under the light-emitting area 312 so that the light-emitting area 312 may be formed to indicate the circuit area 311.

In FIG. 1, the longer sides of the light-emitting area 312 extend parallel to the y-axis, whereas the red pixel Pr, the green pixel Pg, and the blue pixel Pb are arranged in the x-axis direction, however, the present invention is not limited thereto. For example, the long sides of the light-emitting area 312 may instead extend parallel to the x-axis whereas the red pixel Pr, the green pixel Pg, and the blue pixel Pb may instead be arranged in the y-axis direction. The shape and arrangement structure of the light-emitting area 312 and the pixels may be diversely changed or modified by those having skill in the art to which the present invention pertains without departing from the scope and spirit of the invention.

Figure 3:
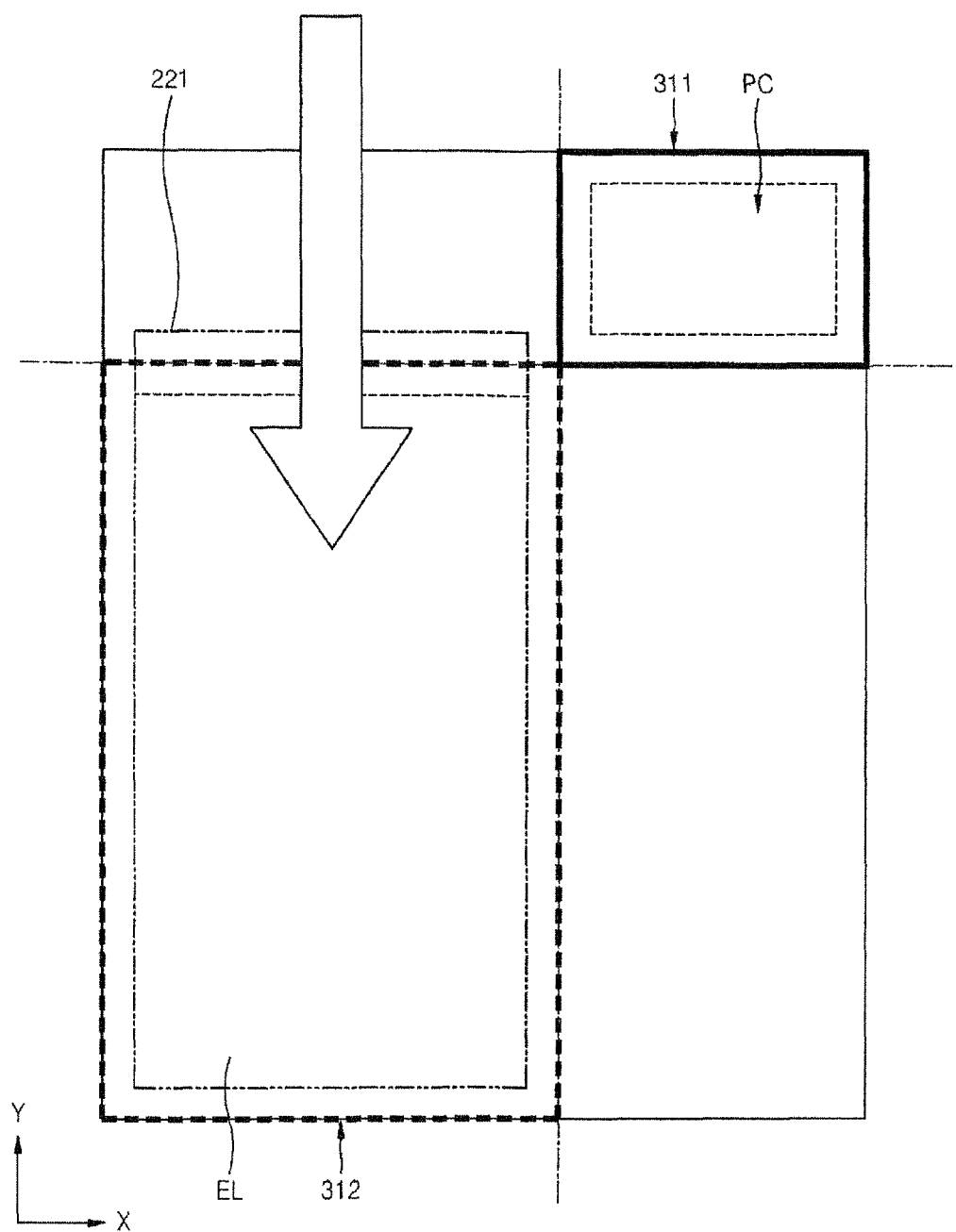
FIG. 3 illustrates forming of an EL layer by a printing method in one of the subpixels of FIG. 1.

Turning now to FIG. 3, FIG. 3 illustrates the method of forming the EL layer EL by a solution deposition technique in one of the subpixels of FIG. 1. In the solution deposition technique, the liquid material is supplied to a defined area and is then dried to form a thin film. Thus, when the liquid material is distributed to one side, the thickness of the thin film may become non-uniform. For example, a solution deposition technique that is a sort of a coating technique may include spin coating, gravure coating, off-set coating, curtain coating, reverse roll coating, slot-die coating, spray coating, nozzle coating, gap coating, dip coating, and air knife coating. A pattern technique may include inkjet printing for forming a film by supplying a liquid material through a nozzle, gravure printing for transferring a pattern to an object to be printed with a liquid material, off-set printing, screen printing, nozzle printing, and electro-spray printing. Referring to FIG. 3, the EL layer EL included in the light-emitting area 312 is formed by an ink-jet printing technique. According to the ink-jet printing technique, a liquid material for forming the EL layer EL is printed in the light-emitting area 312 via a printing nozzle (not shown) to form a thin film. The arrow illustrated in FIG. 3 indicates a moving route of the printing nozzle. In the printing technique, the liquid material is printed in a defined area and is then dried to form a thin film. Thus, when the liquid material is distributed to one side, the thickness of the thin film may not be uniform.

According to the present embodiment, a structure such as the TFTs TR1 and TR2, the capacitor Cst, and a via hole VH in which a step is generated is arranged within the circuit area 311. In contrast, only wiring structures having the same height are arranged around the light-emitting area 312. Thus, the liquid material is not distributed to one side so that the EL layer EL having a uniform thickness may be formed.

Also, in the present embodiment, the circuit area 311 is formed diagonally from the light-emitting area 312. Accordingly, when the printing nozzle moves up and down corresponding to the light-emitting area 312, the circuit area 311 is arranged to be excluded from the progress path of the printing nozzle. Thus, a problem that the liquid material from the printing nozzle intrudes into the circuit area 311 may be prevented.

Figure 4:
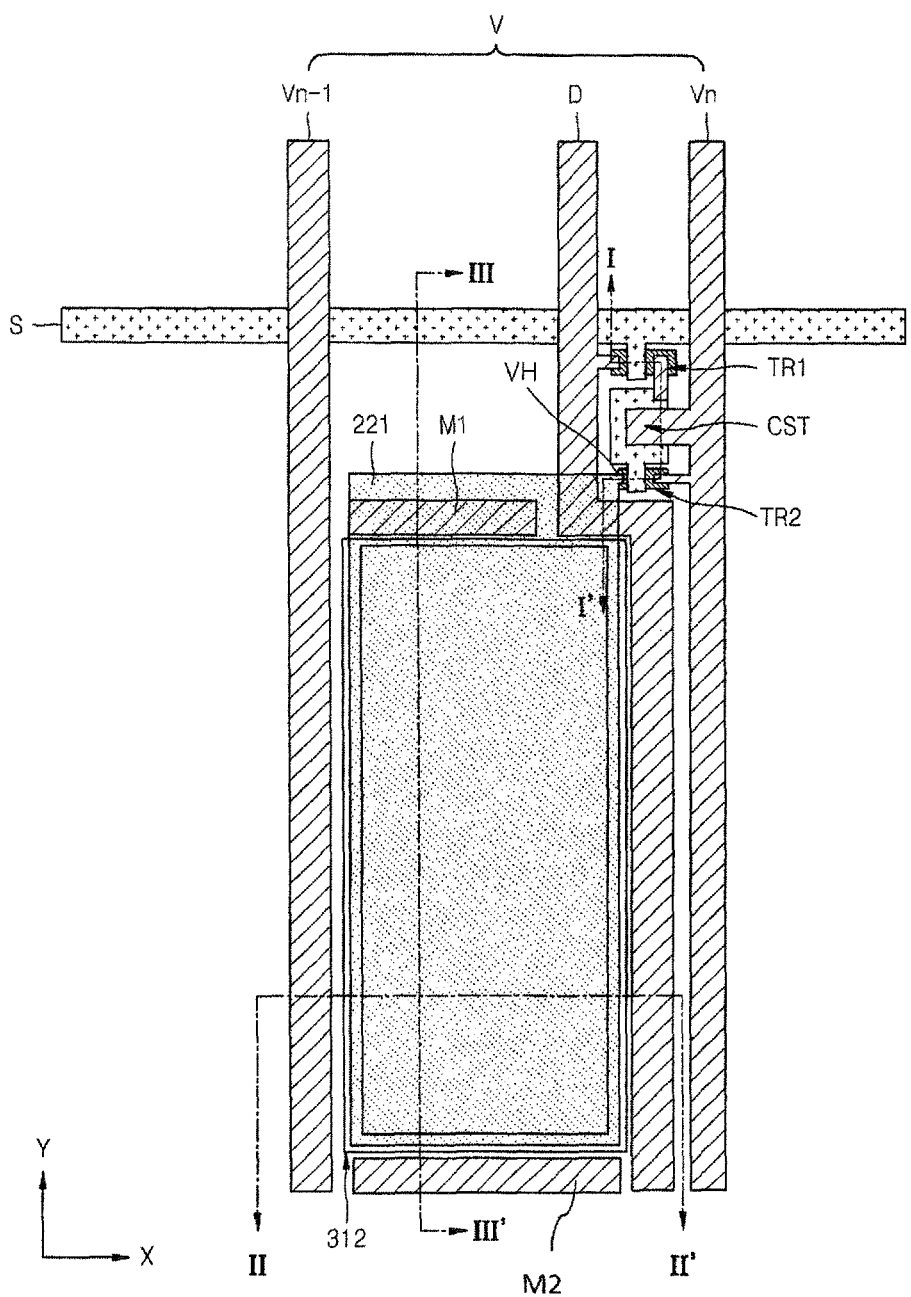
FIG. 4 is a plan view of the circuit area and a light-emitting area of FIG. 2.
Figure 5:
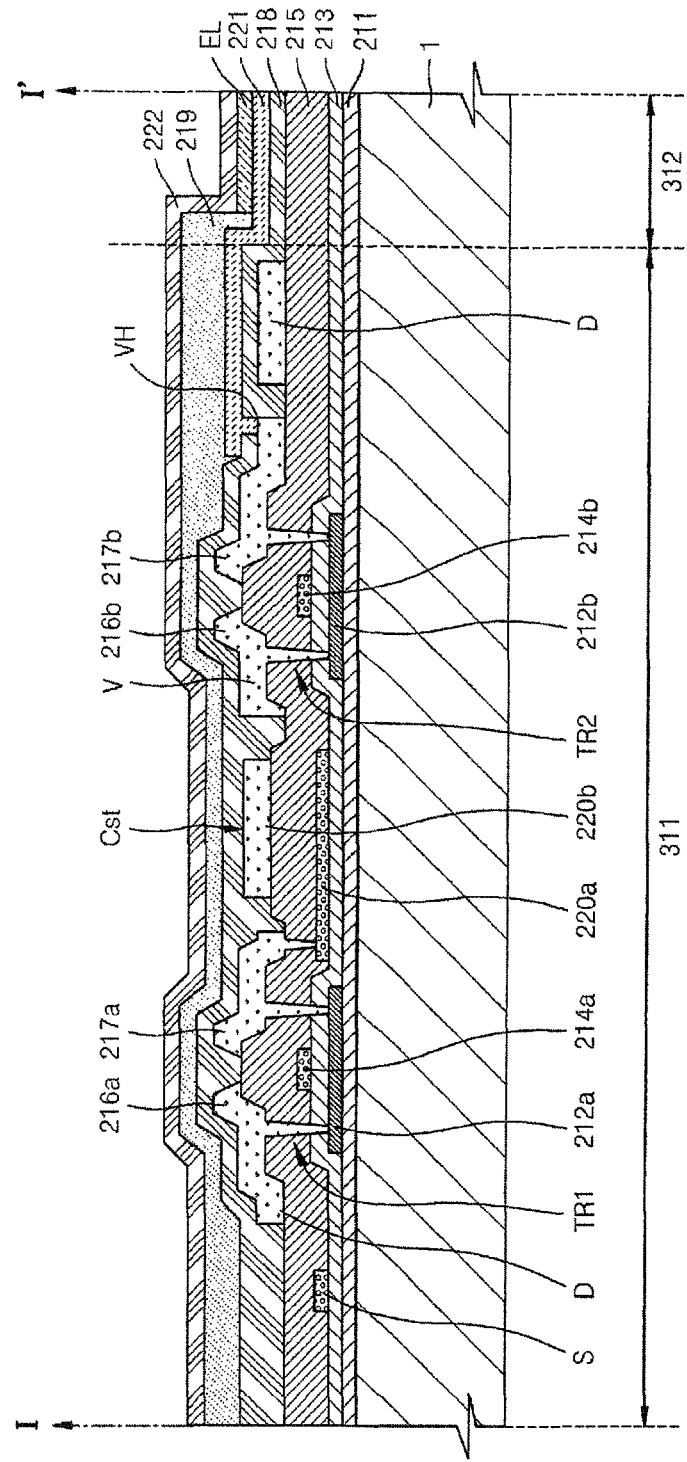
FIG. 5 is a cross-sectional view taken along line I-I' of FIG. 4.
Figure 6:
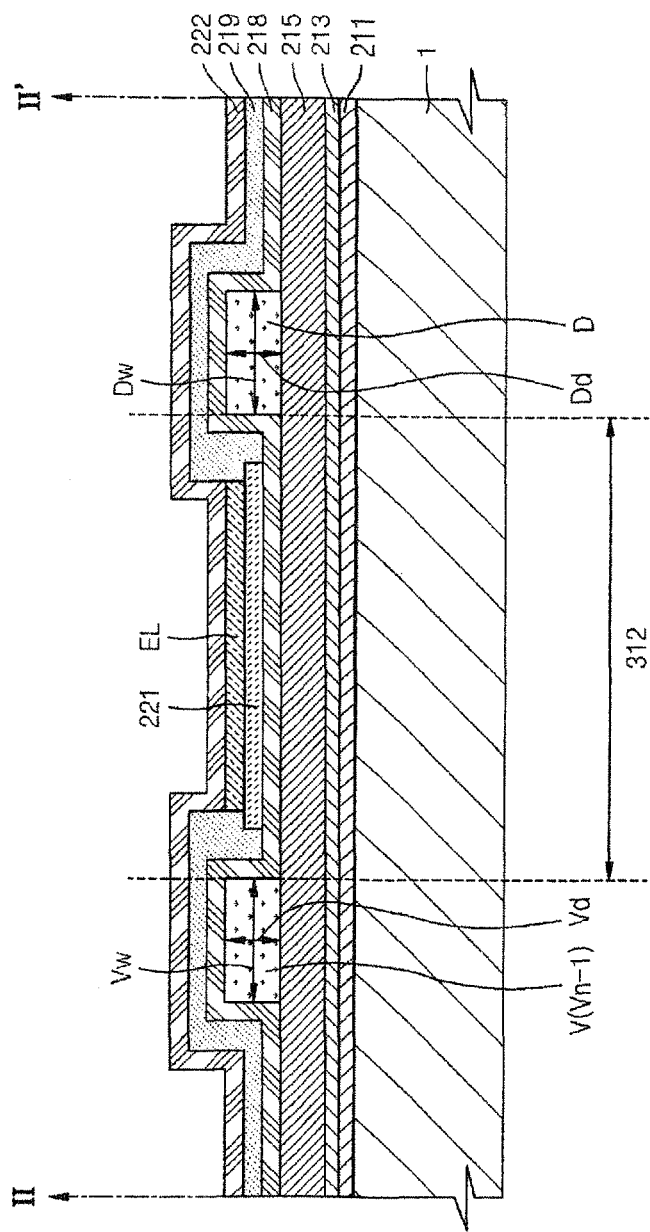
FIG. 6 is a cross-sectional view taken along line II-II' of FIG. 4.
Figure 7:
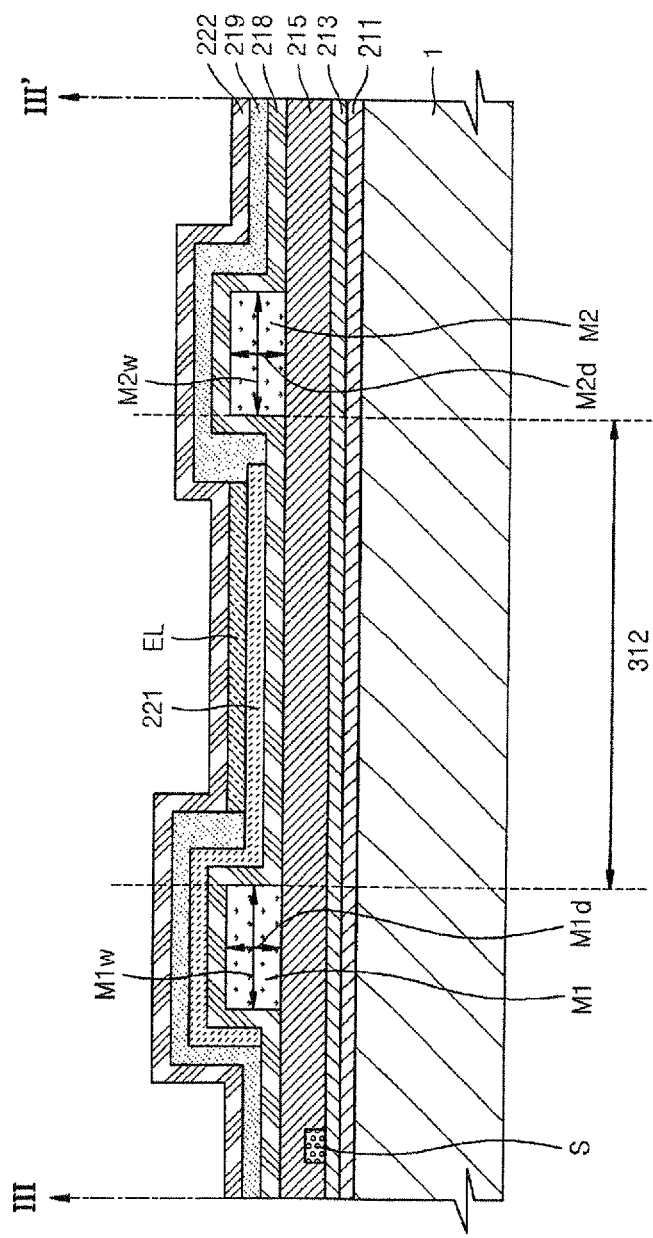
FIG. 7 is a cross-sectional view taken along line III-III' of FIG. 4.

Turning now to FIGS. 4 through 7, FIG. 4 is a plan view of the circuit area and the light-emitting area of FIG. 2, FIG. 5 is a cross-sectional view taken along line I-I' of FIG. 4, FIG. 6 is a cross-sectional view taken along line II-IP of FIG. 4 and FIG. 7 is a cross-sectional view taken along line III-III' of FIG. 4.

Referring to FIGS. 4-7, the scan wiring S is horizontally arranged, whereas the power wiring V and the data wiring D are vertically arranged. Although the scan wiring S is not arranged adjacent to the light-emitting area 312, the power wiring V and the data wiring D are arranged adjacent to the light-emitting area 312.

According to the present embodiment, the power wiring V is parallel to the first major side 312a and is outside of the first major side 312a of the light-emitting area 312. The data wiring D is parallel to the second major side 312b and is outside of the second major side 312b of the light-emitting area 312. The organic light-emitting display device includes the first dummy wiring M1 and the second dummy wiring M2. The first dummy wiring M1 is parallel to the first minor side 312c and is outside of the first minor side 312c of the light-emitting area 312. The second dummy wiring M2 is parallel to the second minor side 312d and is outside of the second minor side 312d of the light-emitting area 312. The power wiring V, the data wiring D, the first dummy wiring M1, and the second dummy wiring M2 are formed on the same plane and are characterized in that the heights and widths thereof are all the same.

Thus, since the light-emitting area 312 is surrounded by the wirings having the same step, when the EL layer EL is formed by a solution deposition technique in the light-emitting area 312, the liquid material is not distributed to one side so that the EL layer EL may have a uniform thickness.

The first dummy wiring M1 and the second dummy wiring M2 may not be electrically coupled to the power wiring V or the data wiring D as illustrated in the drawings. However, the present invention is not limited thereto and the first dummy wiring M1 and the second dummy wiring M2 may instead be electrically coupled to the power wiring V or the data wiring D.

Referring now to FIG. 4, in the light-emitting area 312 of an n-th subpixel, the power wiring V parallel to the first major side 312a is connected to a circuit of an (n−1)th subpixel that is not illustrated and has a reference of Vn−1. The power wiring V connected to the circuit unit 311 of the n-th subpixel, which has a reference of Vn, is arranged to the right of the data wiring D. The data wiring D parallel to the second major side 312b is connected to the circuit area 311 of the n-th subpixel. For convenience of explanation, the power wiring Vn−1 connected to the circuit area of the (n−1)th subpixel and the power wiring Vn connected to the circuit area 311 of the n-th subpixel are interchangeably described herein unless there is any special reason to prevent the interchangeable description.

Referring now to FIG. 5, FIG. 5 is a cross-sectional view taken along line I-I' of FIG. 4 which illustrates in detail the circuit area 311 of FIG. 4. Referring to FIG. 5, a buffer layer 211 is formed on a substrate 1. The first TFT TR1, the capacitor Cst, and the second TFT TR2 are formed on and above the buffer layer 211.

First, a first semiconductor active layer 212a and a second semiconductor active layer 212b are formed on the buffer layer 211. The buffer layer 211 prevents intrusion of foreign materials and planarizes a surface of the substrate 1. The buffer layer 211 may be made out of a variety of materials, for example, inorganic materials such as silicon oxide, silicon nitride, silicon oxynitride, aluminum oxide, aluminum nitride, titanium oxide, or titanium nitride, organic materials such as polyimide, polyester, or acryl, or a delocation thereof. The buffer layer 211 is not an essential element and may be omitted if necessary.

The first semiconductor active layer 212a and the second semiconductor active layer 212b may be made out of polycrystal silicon, however the present invention is not limited thereto and the first semiconductor active layer 212a and the second semiconductor active layer 212b may instead be made out of an oxide semiconductor, for example, a G-I-Z-O layer [$(In_2O_3)_a(Ga_2O_3)_b(ZnO)_c$ layer] where "a", "b", and "c" are real numbers respectively satisfying the conditions that a≥0, b≥0, and c≥0. When the first semiconductor active layer 212a and the second semiconductor active layer 212b are made out of an oxide semiconductor, light transmissivity may be further increased.

A gate insulation layer 213 is formed on the buffer layer 211 to cover the first semiconductor active layer 212a and the second semiconductor active layer 212b. A first gate electrode 214a and a second gate electrode 214b are formed on the gate insulation layer 213.

An interlayer insulation layer 215 is formed on the gate insulation layer 213 to cover the first gate electrode 214a and the second gate electrode 214b. A first source electrode 216a and a first drain electrode 217a, and a second source electrode 216b and a second drain electrode 217b are formed on the interlayer insulation layer 215 and respectively contact the first semiconductor active layer 212a and the second semiconductor active layer 212b via contact holes. The first and second source electrodes 216a and 216b, and the first and second drain electrodes 217a and 217b may be made out of Ag, Mg, Al, Pt, Pd, Au, Ni, Nd, Ir, Cr, Li, or Ca and a compound thereof, or a transparent conductive body, such as ITO, IZO, ZnO, or $In_2O_3$.

Referring to FIGS. 3 and 5, the scan wiring S may be formed simultaneously with the first gate electrode 214a and the second gate electrode 214b. The data wiring D is formed simultaneously with the first source electrode 216a and is connected to the first source electrode 216a. The n-th power wiring Vn is formed simultaneously with the second source electrode 216b and is connected to the second source electrode 216b. Although it is not illustrated, the (n−1)th power wiring Vn−1 is connected to a source electrode of a TFT included in the (n−1)th subpixel.

The capacitor Cst includes an upper electrode 220b and a lower electrode 220a. The lower electrode 220a is formed simultaneously with the first gate electrode 214a and the second gate electrode 214b. Also, the upper electrode 220b is formed simultaneously with the first drain electrode 217a. The upper electrode 220b is connected to the n-th power wiring Vn. Although it is not illustrated, the (n−1)th power wiring Vn−1 is connected to an upper electrode of a capacitor included in the (n−1)th subpixel.

The structures of the first TFT TR1, the capacitor Cst, and the second TFT TR2 are not limited to the above descriptions and a variety of structures for a TFT and a capacitor may be employed. For example, although the first TFT TR1 and the second TFT TR2 each have a top gate configuration, they may instead have a bottom gate configuration in which the first gate electrode 214a and the second gate electrode 214b are respectively arranged under the first semiconductor active layer 212a and the second semiconductor active layer 212b. In addition, all applicable TFT structures may be employed therefor.

A passivation layer 218 covers the first TFT TR1, the capacitor Cst, and the second TFT TR2. The passivation layer 218 may be a single or a plurality of insulation layers. The passivation layer 218 may be made out of an inorganic material and/or an organic material.

As illustrated in FIG. 5, the pixel electrode 221 is formed in the light-emitting area 312 and does not overlap the first TFT TR1, the capacitor Cst, or the second TFT TR2. The pixel electrode 221 is connected to the second drain electrode 217b of the second TFT TR2 through the via hole VH formed in the passivation layer 218. According to the present embodiment, the via hole VH is characteristically formed in the circuit area 311. The pixel electrode 221 is formed in each subpixel as an independent island shown in FIG. 1.

A pixel defining layer 219 is formed on the passivation layer 218 to cover an edge of the pixel electrode 221. The EL layer EL and the opposite electrode 222 are sequentially deposited on the pixel electrode 221. The opposite electrode 222 covers all of the light-emitting area 312 and the circuit area 311.

A low molecular weight or polymer organic layer may be used as the EL layer EL. When a low molecular weight organic layer is used, a hole injection layer (HIL), a hole transport layer (HTL), an emission layer (EML), an electron transport layer (ETL), and an electron injection layer (EIL) are deposited in a single or a combined structure. A variety of materials, such as copper phthalocyanine (CuPc), N,N'-Di (naphthalene-1-yl)-N,N-diphenyl-benzidine (NPB), or tris-8-hydroxyquinoline aluminum (Alq3), may be used as the organic material. According to the present invention, the low molecular weight organic layer may be formed by a printing technique. The HIL, HTL, ETL, and EIL are common layers and may be commonly applied to red, green, and blue pixels.

The pixel electrode 221 may function as an anode electrode, whereas the opposite electrode 222 may function as a cathode electrode, however polarities of the pixel electrode 221 and the opposite electrode 222 may be opposite thereto and still be within the scope of the present invention.

The pixel electrode 221 is formed at a location corresponding to the light-emitting area 312 in each subpixel and is larger than the light-emitting area 312. Also, the pixel electrode 221 may be larger than an area where the EL layer EL is formed. The opposite electrode 222 is formed as a common electrode to cover all subpixels.

According to the present embodiment, the pixel electrode 221 may be a reflection electrode and the opposite electrode 222 may be a transparent electrode. With such an arrangement, the pixel electrode 221 may include a reflection layer made out of Ag, Mg, Al, Pt, Pd, Au, Ni, Nd, Ir, Cr, Li, Ca, or a compound thereof, and ITO, IZO, ZnO, or $In_2O_3$ having a higher work function and the opposite electrode 222 may be made out of metal having a low work function, such as Ag, Mg, Al, Pt, Pd, Au, Ni, Nd, Ir, Cr, Li, Ca, or a compound thereof. In a top emission type in which an image is produced in a direction toward the opposite electrode 222, the opposite electrode 222 may be a thin film in order to increase transmissivity, however the present embodiment is not limited thereto. For example, in the case of a bottom emission type in which an image is produced in a direction toward the substrate 1, the opposite electrode 222 may be a reflection electrode and the pixel electrode 221 may be a transparent electrode. Also, in the case of a dual-emission type, both of the pixel electrode 221 and the opposite electrode 222 may be transparent electrodes.

Turning now to FIG. 6, FIG. 6 is a cross-sectional view taken along line II-II' of FIG. 4, which illustrates in detail the light-emitting area 312 of FIG. 4 and the vicinity thereof. In FIG. 6, descriptions on the constituent elements having the same functions as those described in FIG. 5 will be omitted herein.

Referring now to FIG. 6, the buffer layer 211 is formed on the substrate 1. The gate insulation layer 213 is formed on the buffer layer 211. The interlayer insulation layer 215 is formed on the gate insulation layer 213. The power wiring V and the data wiring D are formed on the interlayer insulation layer 215. In detail, the power wiring V illustrated in FIG. 6 is the (n−1)th power wiring Vn−1 of FIG. 4.

In FIG. 2, the power wiring Vn−1 is formed to the outside of the first major side 312a of the light-emitting area 312 and is parallel to the first major side 312a. The data wiring D is formed to the outside of the second major side 312b of the light-emitting area 312 and is parallel to the second major side 312b. The power wiring V and the data wiring D are separated from each other by the light-emitting area 312. The power wiring V and the data wiring D define the left and right sides of the light-emitting area 312 while forming a step. The power wiring V and the data wiring D are formed on the same plane as the first source electrode 216a, the first drain electrode 217a, the second source electrode 216b and the second drain electrode 217b.

As described above with reference to FIG. 5, since the data wiring D is formed simultaneously with the first source electrode 216a, the data wiring D may be made out of the same material and be arranged on the same plane as the first source electrode 216a. Also, since the power wiring V is formed simultaneously with the second source electrode 216b, the power wiring V may be made out of the same material and be arranged on the same plane as the second source electrode 216b. Thus, the data wiring D and the power wiring V may be made out of Ag, Mg, Al, Pt, Pd, Au, Ni, Nd, Ir, Cr, Li, or Ca and a compound thereof, or a transparent conductive material such as ITO, IZO, ZnO, or $In_2O_3$.

The height Dd of the data wiring D and the height Vd of the power wiring V are the same. Accordingly, the steps of structures around the light-emitting area 312 are formed the same so that, when the EL layer EL is formed by a printing technique, the EL layer EL may have a uniform thickness. The width Dw of the data wiring D and the width Vw of the power wiring V are also the same.

Next, the passivation layer 218 covers the power wiring V and the data wiring D. The pixel electrode 221 is formed on the passivation layer 218 at a location corresponding to the light-emitting area 312, as illustrated in FIG. 6. The pixel electrode 221 may be formed to be greater than the size of the light-emitting area 312.

The pixel defining layer 219 is formed on the passivation layer 218 to cover the edge of the pixel electrode 221. A thin pixel defining layer or a thin passivation layer may be used as the pixel defining layer 219 or the passivation layer 218 to reveal a step in thickness among the data wiring D, the power wiring V, the first dummy wiring M1, and the second dummy wiring M2, but the present invention is not limited thereto.

The EL layer EL, including an organic light emitting layer, is formed on the pixel electrode 221 by a printing technique. The opposite electrode 222 is sequentially deposited on the EL layer EL. The opposite electrode 222 covers all of the light-emitting area 312 and the area around the light-emitting area 312 where the wirings are formed.

Turning now to FIG. 7, FIG. 7 is a cross-sectional view taken along line III-III' of FIG. 4 which illustrates in detail the light-emitting area 312 of FIG. 4 and the vicinity thereof. In FIG. 7, descriptions of the constituent elements having the same functions as those described in FIG. 5 will be omitted herein.

Referring now to FIG. 7, the buffer layer 211 is formed on the substrate 1, the gate insulation layer 213 is formed on the buffer layer 211 and the scan wiring S is formed on the gate insulation layer 213. The scan wiring S may be formed simultaneously with the formation of the first and second gate electrodes 214a and 214b. The interlayer insulation layer 215 is formed on the gate insulation layer 213. The first dummy wiring M1 and the second dummy wiring M2 are formed on the interlayer insulation layer 215.

In FIG. 4, the first dummy wiring M1 is formed on the outside of the first minor side 312c of the light-emitting area 312 and is parallel to the first minor side 312c. The second dummy wiring M2 is formed on the outside of the second minor side 312d of the light-emitting area 312 and is parallel to the second minor side 312d. The first dummy wiring M1 and the second dummy wiring M2 are separated from each other by the light-emitting area 312. The first dummy wiring M1 and the second dummy wiring M2 define the upper and lower sides of the light-emitting area 312 while forming a step. The first dummy wiring M1 and the second dummy wiring M2 are formed on the same plane as the data wiring D and the power wiring V while being separated from the data wiring D and the power wiring V.

The first dummy wiring M1 and the second dummy wiring M2 may be formed simultaneously with the data wiring D, the power wiring V, the source and drain electrodes 216a, 216b, 217a, and 217b. Thus, the first dummy wiring M1 and the second dummy wiring M2 may be made out of Ag, Mg, Al, Pt, Pd, Au, Ni, Nd, Ir, Cr, Li, or Ca and a compound thereof, or a transparent conductive material such as ITO, IZO, ZnO, or $In_2O_3$.

The height M1d of the first dummy wiring M1 and the height M2d of the second dummy wiring M2 are the same. Also, the height M1d of the first dummy wiring M1 and the height M2d of the second dummy wiring M2 are the same as the height Dd of the data wiring D and the height Vd of the power wiring V. Accordingly, when the EL layer EL is formed by a printing technique, the EL layer EL may have a uniform thickness throughout without being skewed to one side. In addition, the width M1w of the first dummy wiring M1, the width M2w of the second dummy wiring M2, the width Dw of the data wiring D and the width Vw of the power wiring V are all the same.

Next, the passivation layer 218 covers the first dummy wiring M1 and the second dummy wiring M2. The pixel electrode 221 is formed on the passivation layer 218 at a location corresponding to the light-emitting area 312, as illustrated in FIG. 7. The pixel electrode 221 extends over the passivation layer 218 covering the upper portion of the first dummy wiring M1. Referring to FIG. 7, the pixel electrode 221 surrounds the upper portion and part of a side surface of the first dummy wiring M1. As the pixel electrode 221 extends over the upper portion of the first dummy wiring M1, the pixel electrode 221 may be electrically connected to the second TFT TR2 of the circuit area 311 through the via hole VH located in the circuit area 311.

As a result, since the pixel electrode 221 extends to cover the upper portion of the first dummy wiring M1, the via hole VH may be in the circuit area 311. Since the via hole VH is not in the light-emitting area 312, even when the liquid material for the EL layer EL is printed on the light-emitting area 312, the liquid material is not skewed to one side so that the EL layer EL having a uniform thickness may be formed.

The pixel defining layer 219 is formed on the passivation layer 218 to cover the edge of the pixel electrode 221 and the portion of the pixel electrode 221 that covers the first dummy wiring M1. The EL layer EL, including an organic light emitting layer, and the opposite electrode 222 are sequentially deposited on the pixel electrode 221.

The opposite electrode 222 is sequentially deposited on the EL layer EL. The opposite electrode 222 covers all of the light-emitting area 312 and the area around the light-emitting area 312 where the wirings are formed.

When the EL layer EL is formed by a printing technique, and not by a delocation technique, the surrounding structure of the EL layer EL is required to have a shape that may prevent the liquid material for the EL layer EL from skewing to one side while the liquid material is being dried and after the printing in the light-emitting area 312.

According to the present embodiment, since the data wiring D, the power wiring V, the first dummy wiring M1, and the second dummy wiring M2 having the same height and width are formed on the same layer and formed around the light-emitting area 312, the step around the light-emitting area 312 is the same. Thus, even when the liquid material for the EL layer EL is supplied onto the pixel electrode 221 by a printing technique, the EL layer having a uniform thickness may be formed without the liquid material being distributed or skewed to one side.

Finally, the opposite electrode 222 covers all of the light-emitting area 312 and the area around the light-emitting area 312 where the wirings are formed.

As illustrated in FIGS. 6 and 7, in the organic light-emitting display device according to the present embodiment, characteristically, the pixel defining layer 219 is formed on the data wiring D, the power wiring V, the first dummy wiring M1, and the second dummy wiring M2, and a top surface of the pixel defining layer 219 that corresponds to each of the first wiring, the second wiring, the first dummy and the second dummy are all arranged on a same plane that is parallel to the substrate. In other words, the extension lines that imaginarily extend from the upper surface of the pixel defining layer 219 corresponding to the data wiring D, the power wiring V, the first dummy wiring M1, and the second dummy wiring M2 substantially meet with one another The above-described characteristics may be satisfied when the first dummy wiring M1 and the second dummy wiring M2 are formed on the same layer as the data wiring D and the power wiring V and the data wiring D, the power wiring V, the first dummy wiring M1, and the second dummy wiring M2 have the same height (thickness). However, the present invention is not limited thereto as the first dummy wiring M1 and the second dummy wiring M2 may not be formed on the same layer as the data wiring D and the power wiring V. For example, the first dummy wiring M1 and the second dummy wiring M2 may be formed on the same layer as the scan wiring S. In this case, the first dummy wiring M1, the second dummy wiring M2, the data wiring D and the power wiring V may all not have the same height (thickness), and the thickness of the first dummy wiring M1 and the second dummy wiring M2 may be greater or less than that of the data wiring D and the power wiring V. This is because the variation in thickness between dummies M1/M2 and wires DN compensate for the dummies M1/M2 being arranged on a different layer than wires D/V. As a result, top surfaces of first dummy wiring M1, second dummy wiring M2, data wiring D and power wiring V can be arranged on a same plane that is parallel to a top surface of the substrate. In other words, each of these top surfaces is parallel to a top surface of the substrate and are equidistant from the top surface of the substrate. And because the layers formed on top of first dummy wiring M1, second dummy wiring M2, data wiring D and power wiring V have uniform thicknesses, the extension lines that imaginarily extend from the upper surface of the pixel defining layer 219 corresponding to the data wiring D, the power wiring V, the first dummy wiring M1, and the second dummy wiring M2 may substantially meet with one another.

Although the scan wiring S is arranged on opposite sides of the light-emitting area 312, the scan wiring S is not directly adjacent to the light-emitting area 312 as structures such as the transistors TR1 and TR2 and the capacitor Cst are arranged between the scan wiring S and the light-emitting area 312. However, according to the present embodiment, the first dummy wiring M1 and the second dummy wiring M2 are characteristically arranged to be directly adjacent to the light-emitting area 312 on opposite sides of the light-emitting area 312. That is, since no other structure is formed between each of the first dummy wiring M1 and the second dummy wiring M2 and the light-emitting area 312, the first dummy wiring M1 and the second dummy wiring M2 may cause the EL layer EL to have a uniform thickness when produced in the light-emitting area 312 by a solution deposition technique.

As described above, according to the present invention, by forming wirings having the same height and width around the light-emitting area, the thickness of the EL layer formed by a printing technique may be maintained constant.

Also, since the circuit area including a via hole is arranged outside a progress path of a printing nozzle used to produce the EL layer, the structure that may affect the thickness of the EL layer is excluded from the light-emitting area so that an EL layer having a constant thickness may be formed.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An organic light-emitting display device, comprising:
   a substrate including a light-emitting area and a circuit area, the circuit area including a thin film transistor, the light-emitting area including an electroluminescent layer, the light-emitting area being bounded by a first side, a second side, a third side and a fourth side, the first side being opposite from a second side, the third side being adjacent to the first side and opposite from the fourth side;
   a first wiring arranged corresponding to the first side of the light-emitting area;
   a second wiring arranged corresponding to the second side of the light-emitting area;
   a first dummy arranged corresponding to the third side of the light-emitting area;
   a second dummy arranged corresponding to the fourth side of the light-emitting area, wherein each of the first wiring, the second wiring, the first dummy, and the second dummy is arranged directly on a same layer and is in direct contact with said same layer; and
   a pixel defining layer arranged on the first wiring, the second wiring, the first dummy and the second dummy, wherein at least one of the first wiring, the second wiring, the first dummy or the second dummy are electrically connected to the circuit area, wherein a top surface of the pixel defining layer that corresponds to each of the first wiring, the second wiring, the first dummy and the second dummy is arranged on a first same plane that is parallel to the substrate.

2. The organic light-emitting display device of claim 1, further comprising a pixel electrode, the pixel defining layer covering edges of the pixel electrode and being a thin passivation layer.

3. The organic light-emitting display device of claim 1, further comprising a pixel electrode, wherein the pixel defining layer includes an opening that exposes a portion of the pixel electrode that corresponds to the light-emitting area.

4. The organic light-emitting display device of claim 1, wherein the first dummy and the second dummy are not electrically coupled to the first wiring and the second wiring.

5. The organic light-emitting display device of claim 1, wherein heights of the first wiring, the second wiring, the first dummy, and the second dummy are all identical and the light-emitting area is surrounded by the first wiring, the second wiring, the first dummy, and the second dummy that have a same step on a side facing the light-emitting area.

6. The organic light-emitting display device of claim 1, wherein the circuit area is arranged diagonally from the light-emitting area and on an opposite side of each of the first dummy and the first wiring from the light-emitting area of a same sub-pixel of the display device.

7. The organic light-emitting display device of claim 1, wherein the thin film transistor comprises:
   an active layer arranged on the substrate;
   a gate insulation layer covering the active layer;
   a gate electrode arranged on the gate insulation layer and corresponding to the active layer;
   an interlayer insulation layer covering the gate electrode; and
   a source electrode and a drain electrode arranged on the interlayer insulation layer, the source electrode and the drain electrode being insulated from the gate electrode and being electrically connected to the active layer, wherein the first wiring, the second wiring, the first dummy, and the second dummy are arranged on a same layer that the source electrode and the drain electrode of the thin film transistor are arranged.

8. The organic light-emitting display device of claim 1, further comprising:
a pixel electrode, the pixel defining layer exposing a portion of the pixel electrode that corresponds to the light-emitting area;
an electroluminescent layer comprising an organic light emitting layer arranged on the pixel electrode within the light emitting area, produced by a solution deposition technique, and having a uniform thickness throughout; and
an opposite electrode arranged on the electroluminescent layer.

9. The organic light-emitting display device of claim 1, the light-emitting area having a perimeter being closely bounded by the first side, the second side, the third side and the fourth side, wherein each of the first wiring, the second wiring, the first dummy and the second dummy being arranged adjacent to and in close proximity with corresponding peripheral edges of the light-emitting area.

10. The organic light-emitting display device of claim 1, wherein the first wiring, the second wiring, the first dummy and the second dummy being arranged directly on and in direct contact with a same second plane that is different from the first plane, wherein the first wiring, the second wiring, the first dummy and the second dummy have a same thickness.

11. The organic light-emitting display device of claim 1, further comprising:
a pixel electrode, the pixel defining layer exposing a portion of the pixel electrode that corresponds to the light-emitting area;
an electroluminescent layer comprising an organic light emitting layer arranged on the portion of the pixel electrode exposed by the pixel defining layer, the electroluminescent layer being produced by a solution deposition technique and having a uniform thickness throughout; and
an opposite electrode arranged on the electroluminescent layer.

12. A method of manufacturing an organic light-emitting display device, comprising:
defining a light-emitting area of a substrate, the light-emitting area having a perimeter being bounded by a first side, a second side, a third side and a fourth side, the first side being opposite from the second side, the third side being adjacent to the first side and opposite from the fourth side;
forming a thin film transistor within a circuit area of the substrate;
forming a first wiring that corresponds to the first side of the light-emitting area;
forming a second wiring that corresponds to the second side of the light-emitting area;
forming a first dummy that corresponds to the third side of the light-emitting area;
forming a second dummy that corresponds to the fourth side of the light-emitting area, wherein at least one of the first wiring, the second wiring, the first dummy or the second dummy are electrically connected to the circuit area, wherein each of the first wiring, the second wiring, the first dummy, and the second dummy is arranged directly on a same layer and is in direct contact with said same layer; and forming a pixel defining layer on the first wiring, the second wiring, the first dummy, and the second dummy, wherein a top surface of the pixel defining layer that corresponds to each of the first wiring, the second wiring, the first dummy and the second dummy is arranged on a same plane that is parallel to the substrate.

13. The method of claim 12, further comprising:
forming a pixel electrode on the substrate, the pixel defining layer having an opening that exposes a portion of the pixel electrode that corresponds to the light emitting area;
forming an electroluminescent layer by a solution deposition technique on portions of the pixel electrode exposed by the pixel defining layer; and
forming an opposite electrode on the electroluminescent layer, wherein the pixel electrode covers an upper portion of the first dummy while surrounding an upper portion of the first dummy and part of a side surface of the first dummy.

14. The method of claim 12, further comprising:
forming a pixel electrode on the substrate prior to the formation of the pixel defining layer;
forming an electroluminescent layer by a solution deposition technique on the pixel electrode, the electroluminescent layer including an organic light emitting material; and
forming an opposite electrode on the electroluminescent layer.

15. The method of claim 12, wherein the first dummy and the second dummy are not electrically coupled to the first wiring and the second wiring.

16. The method of claim 12, wherein heights of the first wiring, the second wiring, the first dummy, and the second dummy are all identical.

17. The method of claim 12, wherein the circuit area is arranged at a location where a first area and a second area overlap, the first area being arranged on an opposite side of an extension line of the third side of the light-emitting area than the light-emitting area and the second area being arranged on an opposite side of an extension line of the second side of the light-emitting area than the light emitting area.

18. The method of claim 12, wherein the thin film transistor is produced by a process comprising:
forming an active layer on the substrate;
forming a gate insulation layer covering the active layer;
forming a gate electrode on the gate insulation layer corresponding to the active layer;
forming an interlayer insulation layer covering the gate electrode; and
forming a source electrode and a drain electrode on the interlayer insulation layer, the source electrode and the drain electrode being insulated from the gate electrode and electrically connected to the active layer.

19. The method of claim 18, further comprising:
forming a passivation layer covering the source electrode and the drain electrode; and
forming a pixel electrode on the passivation layer, wherein the pixel electrode is connected to one of the source electrode and the drain electrode through a via hole arranged in the passivation layer within the circuit area.

20. The method of claim 18, wherein the first wiring, the second wiring, the first dummy, and the second dummy are arranged on a same layer that the source electrode and the drain electrode of the thin film transistor are arranged.

21. The method of claim 12, the light-emitting area having a perimeter being closely bounded by the first side, the second side, the third side and the fourth side, wherein each of the first wiring, the second wiring, the first dummy and the second dummy being arranged adjacent to and in close proximity with corresponding peripheral edges of the light-emitting area.

22. A method of manufacturing an organic light-emitting display device, comprising:
   providing a substrate having a rectangular light-emitting area and a circuit area external to the light emitting area;
   forming a thin film transistor on the substrate and within a circuit area;
   forming a plurality of wirings on all four sides of the light-emitting area to surround the light emitting area, wherein the plurality of wirings are arranged directly on a same layer and are in direct contact with the same layer;
   forming a pixel defining layer on the plurality of wirings, the pixel defining layer having an opening that corresponds to the light emitting area; and
   forming an electroluminescent layer within the opening of the pixel defining layer by a solution deposition technique, the electroluminescent layer having a uniform thickness throughout by having a top surface of portions of the pixel defining layer that corresponds to each of the wirings to be all arranged on a same first plane that is parallel to the substrate, the electroluminescent layer comprising an organic light emitting material.

23. The method of claim 22, wherein a step height of each of the plurality of wirings is equal.

24. The method of claim 22, wherein each of the plurality of wirings is arranged directly on a same second plane that is different from the first plane, and a step height of each of the plurality of wirings on a side facing the light-emitting area prior to the forming of the electroluminescent layer is equal.

25. The method of claim 22, wherein the light-emitting area has a rectangular shape and the plurality of wirings comprise:
   a first wiring arranged corresponding to a first side of the light-emitting area;
   a second wiring arranged corresponding to a second side of the light-emitting area that is opposite to the first side;
   a first dummy arranged corresponding to a third side of the light-emitting area; and
   a second dummy arranged corresponding to a fourth side of the light-emitting area that is opposite to the third side, the light-emitting area having a perimeter being closely bounded by the first side, the second side, the third side and the fourth side, wherein each of the plurality of wirings is arranged adjacent to and in close proximity with corresponding peripheral edges of the light-emitting area.

26. The method of claim 22, wherein the solution deposition process is an ink-jet printing technique.

27. The method of claim 22, further comprising forming a pixel electrode throughout the light-emitting area prior to the forming of the pixel defining layer, the pixel defining layer covering edges of the pixel electrode, the electroluminescent layer covering a remaining portion of the pixel electrode.

28. The organic light-emitting display device of claim 14, the electroluminescent layer having the uniform thickness throughout due to a step height about the light-emitting layer being constant.

29. The organic light-emitting display device of claim 1, the circuit area being external to the light emitting layer and an area defined by a combination of the first wiring, the second wiring, the first dummy and the second dummy, the light emitting layer being absent of a thin film transistor.

30. The organic light-emitting display device of claim 1, the light-emitting area being surrounded by a combination of the first wiring, the second wiring, the first dummy and the second dummy that each have a same step on a side facing the light-emitting area.

31. The method of claim 14, the light-emitting area being surrounded and enclosed by a combination of the first wiring, the second wiring, the first dummy and the second dummy that each have a same step on a side facing the light-emitting area, wherein a thickness of the electroluminescent layer is equal to a height of said step.

32. The method of claim 22, wherein the plurality of wirings have a constant step height on a side facing the light emitting area, said step height corresponds to the thickness of the electroluminescent layer.

* * * * *